United States Patent
Saxod et al.

(10) Patent No.: US 10,748,883 B2
(45) Date of Patent: Aug. 18, 2020

(54) ENCAPSULATION COVER FOR AN ELECTRONIC PACKAGE AND METHOD OF FABRICATION

(71) Applicant: STMicroelectronics (Grenoble 2) SAS, Grenoble (FR)

(72) Inventors: Karine Saxod, Les Marches (FR); Jean-Michel Riviere, Froges (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 0 days.

(21) Appl. No.: 16/182,315

(22) Filed: Nov. 6, 2018

(65) Prior Publication Data
US 2019/0139947 A1    May 9, 2019

(30) Foreign Application Priority Data
Nov. 6, 2017 (FR) ..................... 17 60391

(51) Int. Cl.
*H01L 21/00* (2006.01)
*H01L 25/16* (2006.01)
*H01L 31/0203* (2014.01)
*H01L 31/0232* (2014.01)
*H01L 31/02* (2006.01)
(Continued)

(52) U.S. Cl.
CPC ...... *H01L 25/165* (2013.01); *B29C 45/14336* (2013.01); *B29C 45/14639* (2013.01); *B29C 45/14754* (2013.01); *B29C 69/001* (2013.01); *G01S 7/4813* (2013.01); *H01L 25/167* (2013.01); *H01L 31/0203* (2013.01); *H01L 31/02005* (2013.01); *H01L 31/02325* (2013.01); *H01L 31/167* (2013.01); *H01L 31/18* (2013.01); *H01L 33/005* (2013.01);

*H01L 33/483* (2013.01); *H01L 33/58* (2013.01); *H01L 33/62* (2013.01); *B29C 45/14065* (2013.01); *B29C 2045/1477* (2013.01); *B29C 2793/00* (2013.01); *B29C 2793/009* (2013.01);
(Continued)

(58) Field of Classification Search
CPC ..................... H01L 21/563; B29C 45/14647
See application file for complete search history.

(56) References Cited

U.S. PATENT DOCUMENTS

2003/0057359 A1    3/2003  Webster
2013/0012276 A1*   1/2013  Coffy ................ G01S 7/4813
                                           455/575.1
(Continued)

FOREIGN PATENT DOCUMENTS

WO    2013047683 A1    4/2013

OTHER PUBLICATIONS

INPI Search Report and Written Opinion for FR 1760391 dated Jun. 27, 2018 (8 pages).

*Primary Examiner* — Samuel A Gebremariam
(74) *Attorney, Agent, or Firm* — Crowe & Dunlevy

(57) ABSTRACT

An encapsulation cover for an electronic package includes a cover body having a frontal wall provided with at least one optical element allowing light to pass through. The optical element is inserted into the encapsulation cover by overmolding into a through-passage of the frontal wall. A front face of the optical element is set back with respect to a front face of the frontal wall. The process for fabricating the encapsulation cover includes forming a stack of a sacrificial spacer on top of an optical element, with the stack placed into a cavity of a mold.

5 Claims, 5 Drawing Sheets

(51) Int. Cl.
*H01L 31/167* (2006.01)
*H01L 33/48* (2010.01)
*H01L 33/58* (2010.01)
*H01L 33/62* (2010.01)
*H01L 33/00* (2010.01)
*B29C 45/14* (2006.01)
*B29C 69/00* (2006.01)
*H01L 31/18* (2006.01)
*G01S 7/481* (2006.01)
*B29L 31/34* (2006.01)
*G01S 17/04* (2020.01)

(52) U.S. Cl.
CPC ....... *B29L 2031/3481* (2013.01); *G01S 17/04* (2020.01); *H01L 2933/0058* (2013.01)

(56) References Cited

U.S. PATENT DOCUMENTS

| | | |
|---|---|---|
| 2014/0061447 A1 | 3/2014 | Campbell et al. |
| 2016/0219203 A1 | 7/2016 | Wan et al. |

* cited by examiner

ENCAPSULATION COVER FOR AN ELECTRONIC PACKAGE AND METHOD OF FABRICATION

PRIORITY CLAIM

This application claims the priority benefit of French Application for Patent No. 1760391, filed on Nov. 6, 2017, the content of which is hereby incorporated by reference in its entirety to the maximum extent allowable by law.

TECHNICAL FIELD

Embodiments of the present invention relate to the field of packages, in particular to those which are intended to contain electronic chips including light radiation emitters and/or light radiation sensors, which may colloquially be referred to as "electronic packages".

BACKGROUND

It is known practice to produce electronic packages that comprise electronic chips mounted on substrate wafers and encapsulation covers for the chips, which covers are mounted on the substrate wafers. These encapsulation covers comprise prefabricated cover bodies that have through-passages and shoulders around these passages and are provided with optical elements allowing light to pass through, which are generally made of glass and are added to the shoulders and attached by means of layers of adhesive. It is therefore the distance between the shoulders and the electronic chips that determines the distance between the optical elements and the electronic chips.

SUMMARY

According to one embodiment, an encapsulation cover for an electronic package is provided, which cover comprises a cover body comprising a front or frontal wall provided with at least one optical element allowing light to pass through, which optical element is inserted by overmolding into a through-passage of the frontal wall, and in which the optical element has a front face that is set back with respect to a front face of the frontal wall.

The cover body may comprise a peripheral wall that protrudes with respect to the frontal wall.

The cover body may comprise an inner wall that protrudes with respect to the frontal wall, delimiting two cavities, the frontal wall having two through-passages and being provided with two optical elements facing said cavities, respectively.

An electronic package is also provided, which package comprises a substrate wafer, at least one electronic component including at least one optical sensor and/or one optical emitter, mounted on top of a face of the substrate wafer, and an encapsulation cover such as defined above, mounted on said face of the substrate wafer so as to form a chamber in which the electronic component is located, the frontal wall of the encapsulation cover being in front of the electronic component.

The electronic component may pass through an inner wall of the encapsulation cover.

An electronic package is also provided, which package comprises a substrate wafer, at least two electronic components including at least one optical sensor and/or one optical emitter, mounted on top of a face of the substrate wafer, and an encapsulation cover such as defined above, mounted on said face of the substrate wafer so as to form two cavities in which the electronic components are located, respectively, the frontal wall of the encapsulation cover being in front of the electronic components.

A process for fabricating at least one encapsulation cover for an electronic package is also provided, which process comprises the following steps: forming at least one stack comprising, on top of one another, a sacrificial spacer and an optical element through which light radiation is able to pass, between two opposite faces of a cavity delimited between two portions of a mold, in a position such that a face of the sacrificial spacer and a face of the optical element make contact with the faces of the cavity of the mold, respectively; injecting a coating material into said cavity and setting the coating material, so as to obtain a molded wafer in which the coating material forms at least one cover body having a through-passage into which the optical element is inserted by overmolding; and extracting the molded wafer from the mold and removing the sacrificial spacer, so as to obtain at least one encapsulation cover.

The process may comprise a later step of cutting through the cover body of said molded wafer, at a distance from the optical element.

BRIEF DESCRIPTION OF THE DRAWINGS

Electronic packages comprising encapsulation covers and modes of fabrication will now be described by way of exemplary embodiments illustrated by the appended drawing, in which.

DETAILED DESCRIPTION

Figure 1:
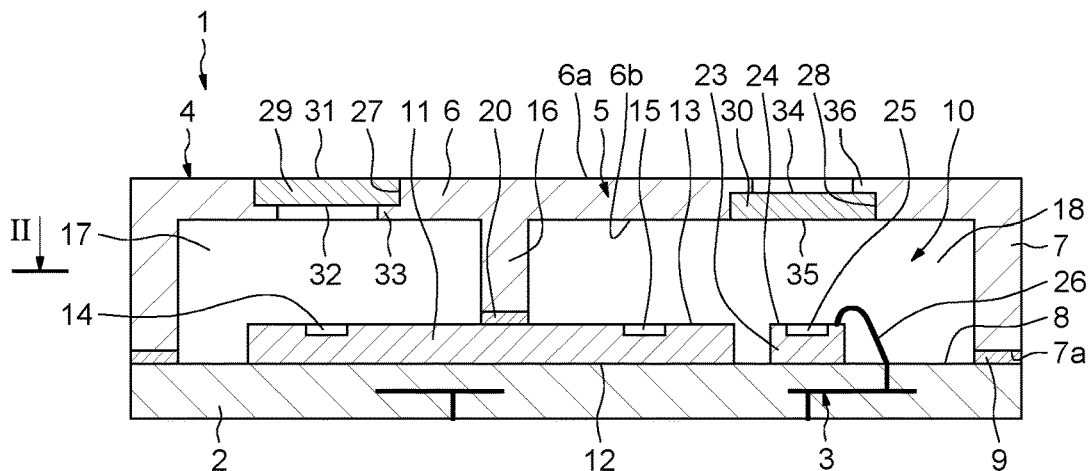
FIG. 1 shows a longitudinal cross section of an electronic package, along I-I of FIG. 2.
Figure 2:
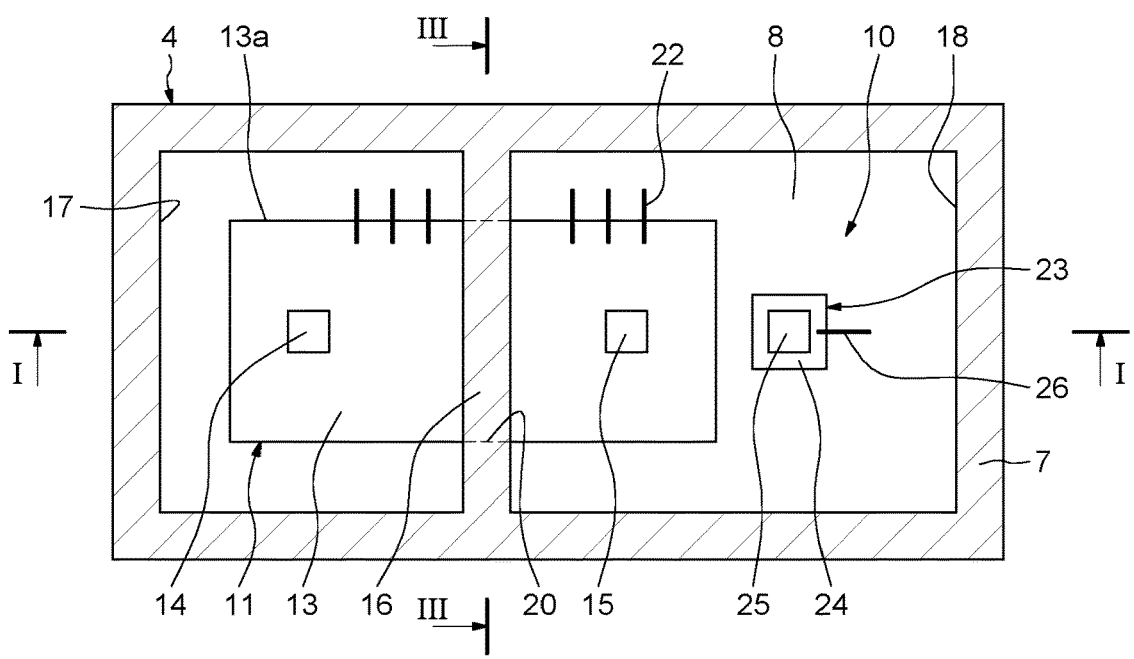
FIG. 2 shows a horizontal cross section of the electronic package of FIG. 1, along II-II of FIG. 1.
Figure 3:
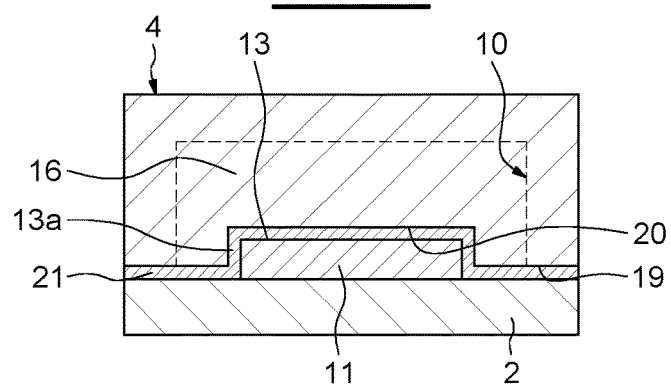
FIG. 3 shows a transverse cross section of the electronic package of FIG. 1, along of FIG. 2.

FIGS. 1 to 3 illustrate an electronic package 1 that comprises a substrate wafer 2 including a network of electrical connections 3, from one face of this wafer to the other, and an encapsulation cover 4 that comprises a cover body 5, made of a molded material, that comprises a front or frontal wall 6 that is parallel to the substrate wafer 2 and a peripheral wall 7 that extends backwards, a back end edge 7a of which is attached to a peripheral zone of a front face 8 of the substrate wafer 2 by means of a bead of adhesive 9, so as to delimit a chamber 10.

The electronic package 1 comprises an electronic chip 11 that is installed in the chamber 10 and has a back face 12 that is bonded to the front face 8 of the substrate wafer 2, the encapsulation cover 4 being at a distance from the chip 11, the front wall 6 being in front of the electronic chip 11.

According to the example shown, the chip 11 comprises, in its front face 13, two optical sensors 14 and 15 that are longitudinally remote from one another.

The cover body 5 of the encapsulation cover 4 comprises a transverse inner separating partition (wall) 16 that protrudes from the frontal wall 6 and joins two opposite sides of the peripheral wall 7.

The inner separating partition 16 divides the chamber 10 into two cavities 17 and 18 and straddles the chip 11 at a site such that the sensors 14 and 15 are located on either side and at a distance from the inner separating partition 16, inside the cavities 17 and 18.

The inner separating partition 16 has a back edge 19 that is provided with a notch 20 through which the chip 11 passes. A bead of adhesive 21 is interposed between the back edge 19 and the zones of the front face 8 of the substrate wafer 2 that are located on either side of the chip 11 and between the notch 20 and zones of the front face 13 and flanks 13a of the chip 11.

The chip 11 is linked to the network of electrical connections 3 of the substrate wafer 2 by means of electrical wires 22.

An electronic chip 23 that is bonded to the front face 108 of the substrate wafer 2, beside the chip 11, is installed inside the cavity 18. The chip 23 comprises, in its front face 24, a light radiation emitter 25 and it is linked to the network of electrical connections 3 by electrical wires 26.

The frontal wall 6 of the cover body 5 of the encapsulation cover 4 has through-openings 27 and 28 that are provided with optical elements 29 and 30 allowing light to pass through between the cavities 17 and 18 and the exterior, respectively.

The substrate wafer 2, the cover body 5 of the encapsulation cover 4, the bead of adhesive 9 and the bead of adhesive 21 are made of opaque materials.

The electronic package 1 may operate in the following way.

The emitter 25 of the chip 11 emits light, for example infrared, radiation outwards through the optical element 30. This light radiation present in the cavity 18 is detected by the sensor 15 of the chip 11. The sensor 14 of the chip 11 detects external light radiation through the optical element 29.

The optical elements 29 and 30 may be made of glass and either or both of them may be treated so as to form lenses and/or light filters. For example, the optical element 29 may be treated so as to form an infrared filter and an optical lens for focusing light towards the sensor 14.

Advantageously, the electronic package 1 may constitute a means for detecting the proximity of a body in front of the encapsulation cover 4 by processing the signals arising from the sensors 14 and 15.

The encapsulation cover 4 is obtained by overmolding the cover body 5 around the optical elements 29 and 30.

The optical elements 29 and 30 may have different outlines and different thicknesses.

According to the example shown, the optical element 29 is parallelepipedal and has a front or frontal face 31 that is located in the plane of the front face 6a of the frontal wall 6 and a back face 31 that is set forwards (i.e., offset) with respect to the back face 6b of the frontal wall 6. The through-passage 27 of the cover body 5 has a back inner shoulder 33 behind the periphery of the back face of the optical element 29.

Furthermore, the optical element 30 is parallelepipedal and has a front face 34 that is set back (i.e., offset) with respect to the front face 6a of the frontal wall 6 and a back face 35 in the plane of the back face 6b of the frontal wall 6. The through-passage 28 of the cover body 5 has a front inner shoulder 36 in front of the periphery of the front face 34 of the optical element 30.

One embodiment of such an encapsulation cover 4, resulting from a wafer-scale overmolding fabrication process, will now be described.

Figure 4:
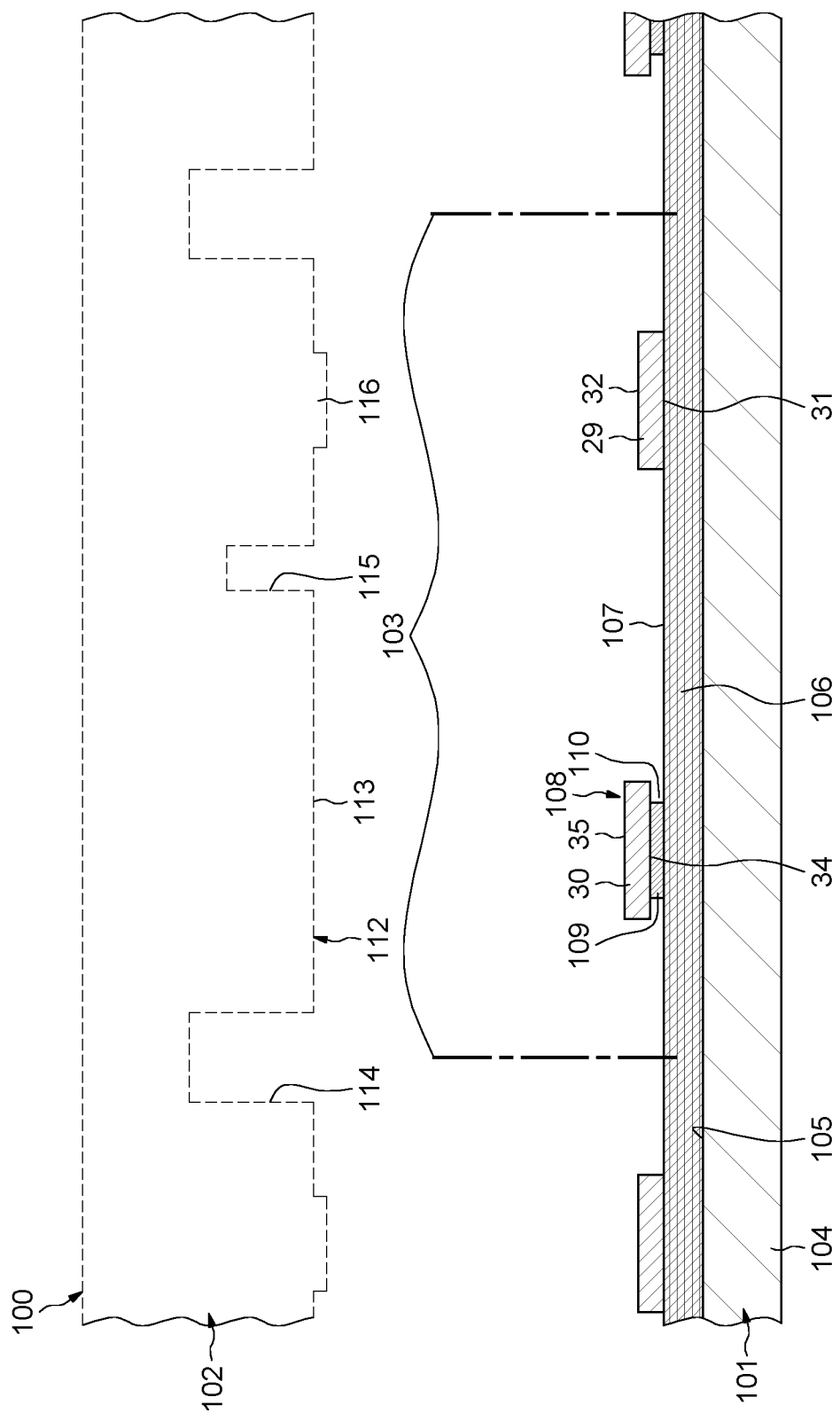
FIG. 4 shows a step of fabricating an encapsulation cover in a mold, in the open state.

As illustrated in FIG. 4, a mold 100 comprises a lower portion 101 and an upper portion 102 that are suitable for the wafer-scale fabrication of a plurality of encapsulation covers 4 at adjacent sites 103.

The lower portion 101 of the mold 100 comprises a base 104, including an upper flat surface 105 which is covered by a layer 106 of an adhesive material, this layer 106 having a flat upper surface 107.

At each site 103, an optical element 29 is placed on top of the surface 107 of the lower portion 101 of the mold 100, the face 31 of the optical element 29 being bonded to the adhesive layer 106 of the portion 101 of the mold 10.

Furthermore, a stack 108 that comprises a sacrificial spacer 109, made of an adhesive material, is formed on top of the surface 107 of the lower portion 101 of the mold 100, and an optical element 30 is formed on top of the sacrificial spacer 109. The spacer 109 is bonded to the adhesive layer 106 and the face 34 of the optical element 29 is bonded to the sacrificial spacer 109.

The optical elements 29 and 30 are placed so as to correspond with those of the encapsulation covers 4 to be obtained.

The thickness of the sacrificial spacer 109 corresponds to the distance between the face 34 of the optical element 30 and the back face of the wall 6 of the encapsulation covers to be obtained.

An annular void 110 is formed around the sacrificial spacer 109, between the face 34 of the optical element 30 and the surface 107 of the portion 101 of the mold 100, which void corresponds to the shoulder 28 of the encapsulation covers 4 to be obtained.

Figure 5:
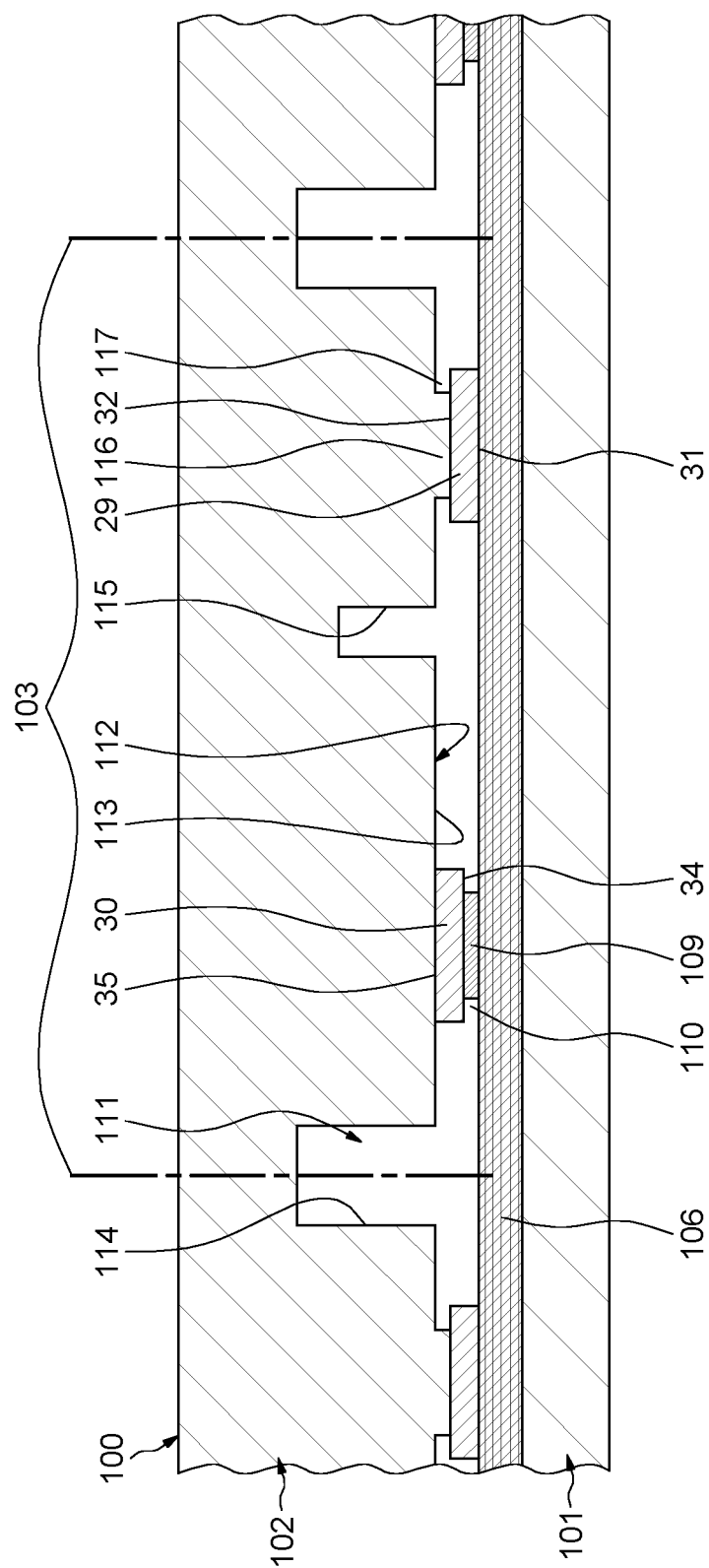
FIG. 5 shows another step of fabricating an encapsulation cover in the mold of FIG. 4, in the closed state.

Once this has been done, as illustrated in FIG. 5, the mold 100 is closed by placing the upper portion 102 of the mold 100 on top of the lower portion 101. In this closed position, the mold 100 delimits a cavity 111, between the surface 107 of the lower portion 101 and a face 112 of the upper portion 102.

At each site 103, the dimensions and shapes correspond to the cover bodies 5 of the encapsulation covers 4 to be obtained.

More particularly, the face 112 of the upper portion 102 of the mold 100 has a flat face 113 that is parallel to the surface 107 and bears against the faces 35 of the optical elements 30.

The face 112 additionally has grooves 114 that extend longitudinally and transversely and that correspond to the peripheral walls 7 of the adjacent encapsulation covers 4 to be obtained, the thickness of the grooves 114 being slightly greater than twice the thickness of a peripheral wall 7 of the encapsulation covers 4 to be obtained.

The face 112 also has grooves 115 that correspond to the partitions (inner walls) 16 of the encapsulation covers 4 to be obtained.

The face 112 additionally has protruding bosses 116, one face of which bears against the faces 32 of the optical elements 29 while determining voids 117 around the optical elements 29.

Figure 6:
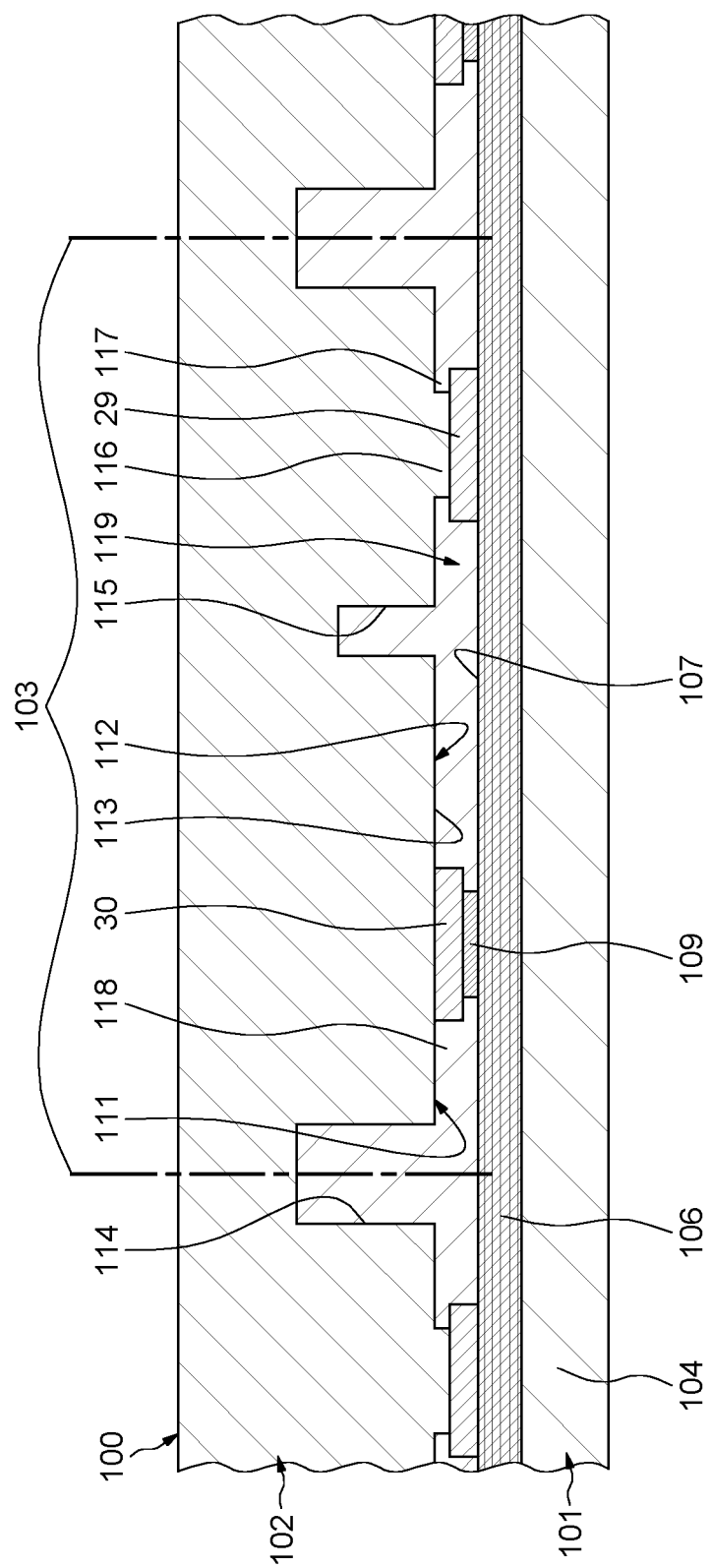
FIG. 6 shows another step of fabricating an encapsulation cover in the mold of FIG. 4, in the closed state.

This being so, as illustrated in FIG. 6, a coating material 118, for example an epoxy resin, is collectively injected into the cavity 111, and the coating material is allowed to set in order to overmold the coating material 118 around the optical elements 29 and 30 and to obtain a molded wafer 119 which, at each site 103, includes a cover body 5 provided with the optical elements 29 and 30.

The thickness of the sacrificial spacers 109 determines the distance between the optical elements 30 and the bottom of the grooves 114 and hence determines the distance between the optical elements 30 and the attachment end 7a of the peripheral walls 6 that are made in the grooves 114.

Figure 7:
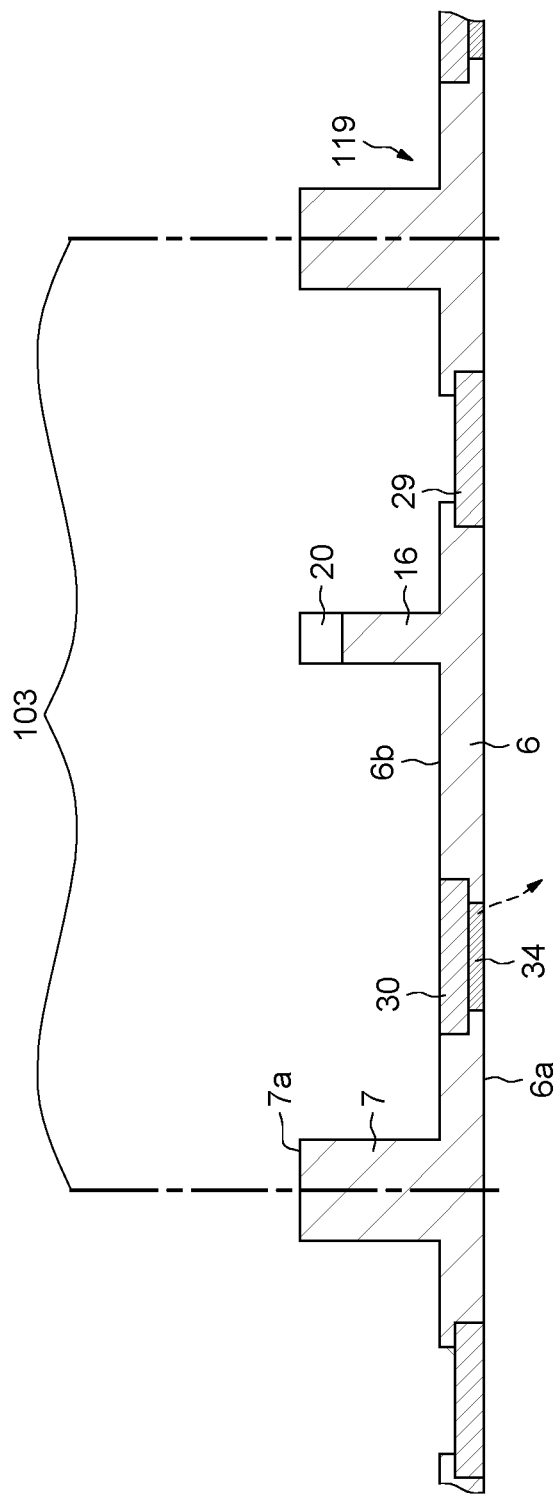
FIG. 7 shows a cross section of an encapsulation cover out of the mold.

Next, the molded wafer 119 is extracted from the mold 100 and, as illustrated in FIG. 7, the sacrificial spacers 109 are removed. The collective molded wafer 119 then includes, at the sites 103, finished encapsulation covers 4, linked by their peripheral walls 7.

Advantageously, the sacrificial spacers 109 may be made of a material that is suitable for removal under the effect of heat or made of a material that is suitable for removal under the effect of suitable light radiation, resulting in chemical decomposition, debonding or shrinking of the material, without any mechanical intervention other than, potentially, cleaning.

According to one variant use, the collective molded wafer 119 is sawn through sections formed in the grooves 114, so as to singulate the encapsulation covers 4.

Having a collective substrate wafer provided, at certain sites, with networks of electrical connections 3 and provided, at these sites, with chips 11 and 23, an encapsulation cover 4 is placed over each site of the collective substrate wafer by means of beads of adhesive 9 and 20.

Next, the collective substrate wafer is sawn between the mounted encapsulation covers 4.

A plurality of singulated electronic packages 1 is then obtained.

According to another variant use, having a collective substrate wafer provided, at certain sites, with networks of electrical connections 3 and provided, at these sites, with chips 11 and 23, the collective molded wafer 119 is placed onto this collective substrate wafer.

Next, the collective substrate wafer and the collective molded wafer 119 are sawn.

A plurality of singulated electronic packages 1 is then obtained.

According to one variant embodiment of the electronic package 1, the shoulder 36 of the through-passage 27 receiving the optical element 30 is omitted. In this case, in the mold 100, the sacrificial spacer 109 covers the face 34 of the optical element 30.

According to one variant embodiment of the electronic package 1, the optical element 29 is located in a manner equivalent to the optical element 30. In this case, the optical element 29 is placed on top of the face 107 of the lower portion 101 of the mold 100 by means of a sacrificial spacer that is equivalent to the sacrificial spacer 34, the boss 116 of the lower portion 102 of the mold 100 being omitted.

According to one variant embodiment, the optical element 30 may extend backwards beyond the back face 6b of the front wall 6. In this case, the face 112 of the upper portion 102 of the mold 100 comprises a void against the bottom of which the back face of the optical element 30 bears.

According to one variant embodiment of the electronic package 1, an equivalent electronic package comprises separate chips that are respectively entirely located within cavities delimited by an inner wall of an encapsulation cover that is provided by overmolding optical elements allowing light to pass into and out of the cavities.

According to one variant embodiment of the electronic package 1, an equivalent electronic package comprises an encapsulation cover for a chip provided with an emitter or with a light radiation sensor, this encapsulation cover being provided with a cover body that is overmolded around a single optical element, in a manner equivalent to the optical element 30.

The invention claimed is:

1. A process for fabricating at least one encapsulation cover for an electronic package, comprising:
    forming a first stack between two opposite faces of two portions of a mold defining a cavity, the first stack comprising, on top of one another, a sacrificial spacer and an optical element through which light radiation is able to pass, the first stack positioned such that a face of the sacrificial spacer and a face of the optical element make contact with the two opposite faces of the mold, respectively;
    injecting a coating material into said cavity and setting the coating material, so as to obtain a molded wafer in which the coating material forms at least one cover body having a through-passage into which the optical element is inserted by overmolding; and
    extracting the molded wafer from the mold and removing the sacrificial spacer, so as to obtain said at least one encapsulation cover.

2. The process according to claim 1, further comprising cutting through the cover body of said molded wafer, at a distance from the optical element, after extracting.

3. The process according to claim 1, wherein one face of said two opposite faces includes longitudinal and transverse grooves which are spaced apart from the stack and wherein injecting the coating material further comprises injecting the coating material into the longitudinal and transverse grooves to form longitudinal and transverse molded portions of the molded wafer.

4. The process according to claim 3, further comprising cutting the cover body of said molded wafer longitudinally and transversally through the longitudinal and transverse molded portions, at a distance from the optical element, to define peripheral edges of said at least one encapsulation cover.

5. A process for fabricating a plurality of encapsulation covers for an electronic package, comprising the following steps:
    forming a plurality of stacks, wherein each stack comprises, on top of one another, a sacrificial spacer and an optical element through which light radiation is able to pass;
    arranging the plurality of stacks in a cavity between two opposite parallel faces of two portions of a mold such that a face of the sacrificial spacer and a face of the optical element make contact, respectively, with the two opposite parallel faces;
    wherein one face of said two opposite faces includes longitudinal and transverse grooves which are spaced apart from each of the stacks;
    injecting a coating material into said cavity and setting the coating material, so as to obtain a molded wafer in which the coating material forms at least one cover body having a through-passage into which the optical element is inserted by overmolding and in which the coating material forms longitudinal and transverse molded portions;
    extracting the molded wafer from the mold and removing the sacrificial spacer; and
    cutting the molded wafer longitudinally and transversally through the longitudinal and transverse molded portions so as to obtain said plurality of encapsulation covers.

* * * * *